US010530307B2

(12) United States Patent  
Li et al.

(10) Patent No.: US 10,530,307 B2  
(45) Date of Patent: Jan. 7, 2020

(54) NEGATIVE FEEDBACK GAIN TRANSIMPEDANCE AMPLIFIER (TIA) SYSTEMS

(71) Applicant: Hewlett Packard Enterprise Development LP, Houston, TX (US)

(72) Inventors: Cheng Li, Palo Alto, CA (US); Zhihong Huang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 35 days.

(21) Appl. No.: 15/768,874

(22) PCT Filed: Oct. 26, 2015

(86) PCT No.: PCT/US2015/057314  
§ 371 (c)(1),  
(2) Date: Apr. 17, 2018

(87) PCT Pub. No.: WO2017/074297  
PCT Pub. Date: May 4, 2017

(65) Prior Publication Data  
US 2019/0238097 A1    Aug. 1, 2019

(51) Int. Cl.  
*H03F 3/08* (2006.01)  
*H03F 1/08* (2006.01)  
*H03F 1/34* (2006.01)  
*H04B 10/69* (2013.01)  
*H04B 10/116* (2013.01)  
(Continued)

(52) U.S. Cl.  
CPC ............... *H03F 1/086* (2013.01); *H03F 1/22* (2013.01); *H03F 1/347* (2013.01); *H03F 3/082* (2013.01); *H03F 3/72* (2013.01); *H04B 10/116* (2013.01); *H04B 10/693* (2013.01)

(58) Field of Classification Search  
CPC ............. H03F 3/08; H03F 3/082; H03F 3/087  
USPC ................. 330/308, 79; 250/214 A, 214 AG  
See application file for complete search history.

(56) References Cited

U.S. PATENT DOCUMENTS

| 4,754,233 A | 6/1988 | Pickett |
| 5,164,682 A | 11/1992 | Taralp |
| 5,287,340 A | 2/1994 | Chapman et al. |

(Continued)

FOREIGN PATENT DOCUMENTS

| EP | 2747279 A1 | 6/2014 |
| JP | 05-160647 A | 6/1993 |

OTHER PUBLICATIONS

Lu C. et al., "Bandwidth Enhancement Techniques for Transimpedance Amplifier in CMOS Technologies," (Research Paper), Sep. 18-20, 2001, 1 page, (abstract only).

(Continued)

*Primary Examiner* — Steven J Mottola  
(74) *Attorney, Agent, or Firm* — Sheppard Mullin Richter & Hampton LLP

(57) ABSTRACT

One embodiment describes a transimpedance amplifier (TIA) system. The system includes a transistor arranged between an input node and an output node to set an amplitude of an output voltage at the output node based on an amplitude of an input current signal provided at the input node. The system also includes a negative feedback transformer coupled to the transistor to provide a negative feedback gain with respect to the output voltage to substantially increase transconductance of the transistor.

14 Claims, 1 Drawing Sheet

(51) Int. Cl.
*H03F 1/22* (2006.01)
*H03F 3/72* (2006.01)

(56) References Cited

U.S. PATENT DOCUMENTS

| | | |
|---|---|---|
| 5,815,012 A | 9/1998 | Rivoir et al. |
| 6,172,563 B1 | 1/2001 | Trask |
| 6,271,721 B1 | 8/2001 | Trask |
| 6,462,327 B1 | 10/2002 | Ezell et al. |
| 7,944,290 B2 | 5/2011 | Yeung et al. |
| 2006/0078269 A1* | 4/2006 | Baek .................. H03F 3/08 385/147 |
| 2012/0062322 A1 | 3/2012 | Owen |
| 2014/0185661 A1 | 7/2014 | Chang et al. |
| 2014/0191800 A1 | 7/2014 | Jordan |
| 2014/0292413 A1 | 10/2014 | Kim et al. |

OTHER PUBLICATIONS

Amid et al., "Fully differential, 40 Gb/s regulated cascode transimpedance amplifier in 0.13 μm SiGe BiCMOS technology," in Proc. IEEE BCTM, 2010, pp. 33-36.

International Search Report and Written Opinion received for PCT Patent Application No. PCT/US15/057314, dated Jul. 20, 2016, 10 pages.

Park et al., "1.25-Gb/s regulated cascode CMOS transimpedance amplifier for gigabit ethernet applications," IEEE Journal of Solid-State Circuits, vol. 39, No. 1, Jan. 2004, pp. 112-121.

\* cited by examiner

NEGATIVE FEEDBACK GAIN TRANSIMPEDANCE AMPLIFIER (TIA) SYSTEMS

BACKGROUND

Transimpedance amplifier (TIA) systems, such as voltage-mode inverter TIAs, can be implemented for a variety of optical communication circuits. For example, a current corresponding to an intensity of an optical signal can be provided to the TIA system, such that the TIA system can convert the current to a voltage in a high-speed optical communication application. TIA systems typically determine the overall optical link performance, as the speed and sensitivity of the TIA system can set the maximum data rate and tolerable channel loss of the optical system. However, the photodiode of an optical receiver may have a potentially large parasitic capacitance, which can deteriorate both the bandwidth and noise performance of the TIA system.

DETAILED DESCRIPTION

A transimpedance amplifier (TIA) system disclosed herein employs a negative feedback transformer that is configured to provide passive negative-feedback gain to enhance the effective transconductance of the input common-gate transistor of the TIA system. As a result, the input resistance of the TIA system can be reduced. In addition, the TIA system can be implemented in an optical receiver system that includes a photodiode configured to generate a current input signal based on an intensity of an optical signal. In this example receiver system, the negative feedback transformer can be further configured to isolate parasitic capacitance associated with the photodiode. The TIA system thus allows for considerable bandwidth extension without significant noise degradation or power consumption, in contrast to traditional transistor-based regulated cascode architectures.

Figure 1:
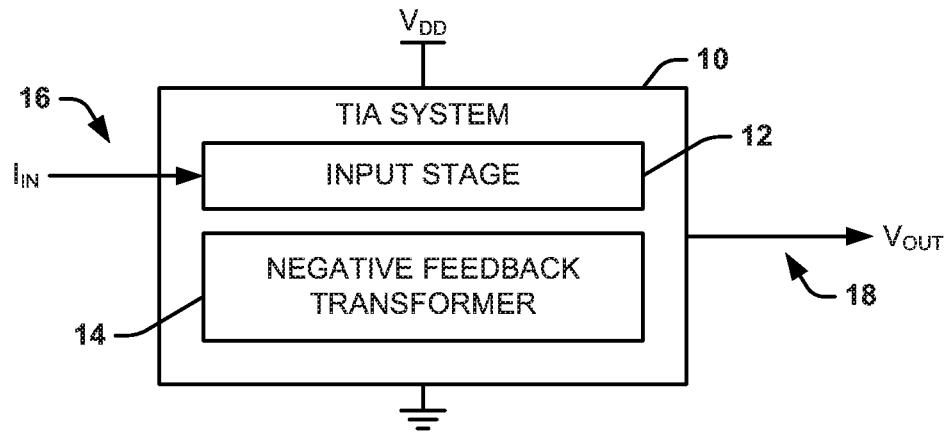
FIG. 1 illustrates an example of a transimpedance amplifier system.

FIG. 1 illustrates an example of a TIA system 10. The TIA system 10 can be implemented in a variety of applications, including an optical receiver system. The TIA system 10 is configured to amplify an input current signal, demonstrated in the example of FIG. 1 as a current $I_{IN}$, to generate an output voltage signal $V_{OUT}$.

The TIA system 10 includes an input stage 12 and a negative feedback transformer 14. As an example, the input stage 12 can be configured as a common-gate transistor arrangement that is configured to convert the current input signal $I_{IN}$ that is received at an input node 16 to the output voltage signal $V_{OUT}$ that is provided at an output node 18. The input current signal $I_{IN}$ can be generated from a variety of sources, such as a photodiode in an optical receiver system. The input stage 12 can be arranged between a high voltage rail, demonstrated as a voltage $V_{DD}$, and a low voltage rail, demonstrated as ground. Therefore, the input stage 12 can convert the amplitude of the input current signal $I_{IN}$ to a corresponding amplitude of the output voltage signal $V_{OUT}$.

The negative feedback transformer 14 can be arranged with respect to the input stage 12 to provide negative feedback gain of the output voltage signal $V_{OUT}$ to substantially increase a transconductance of the input stage 12. For example, the negative feedback transformer 14 includes a primary winding that can be coupled to the input node 16 and can include a secondary winding that can be coupled to a control terminal of the input stage 12. For example, the control terminal can be a gate of the common-gate transistor, with the gate receiving a predetermined DC bias voltage. Therefore, the secondary winding of the negative feedback transformer 14 can be arranged in series between the bias voltage and the gate of the common-gate transistor of the input stage 12. Accordingly, negative feedback gain is achieved via the mutual magnetic coupling in the negative feedback transformer based on anti-phase operation between the source and gate of the common-gate transistor of the input stage 12. As a result, the transconductance of the common-gate transistor of the input stage 12 is increased.

Figure 2:
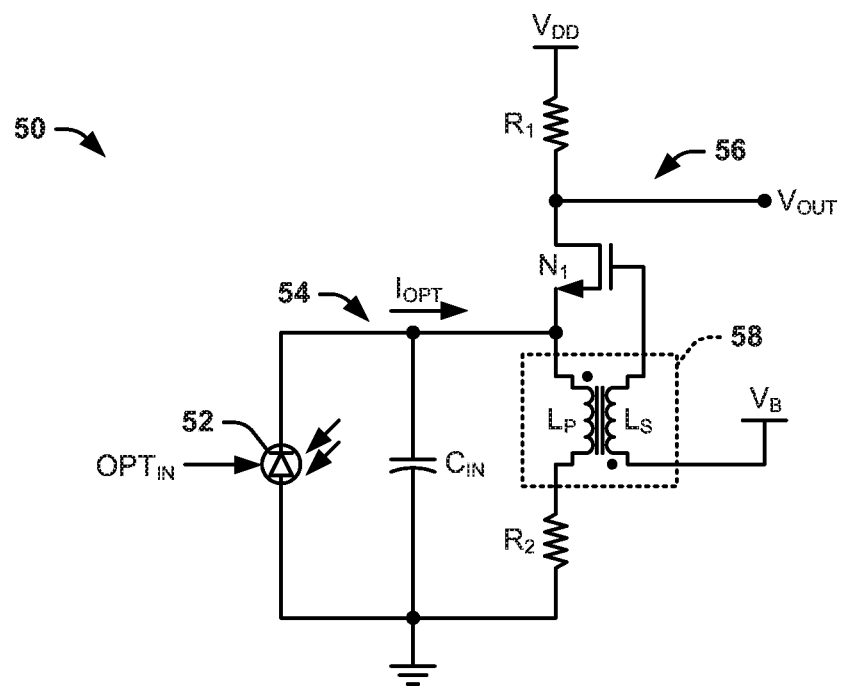
FIG. 2 illustrates an example of a transimpedance amplifier circuit.

FIG. 2 illustrates an example of a TIA circuit 50. The TIA circuit 50 can correspond to the TIA system 10 in the example of FIG. 1, as implemented in an optical receiver system. Thus, in the example of FIG. 2, the TIA circuit 50 includes a photodiode 52 that is configured to receive an optical input signal $OPT_{IN}$ that is arranged between an input node 54 and a high rail voltage, demonstrated in the example of FIG. 2 as a voltage $V_{DD}$. As an example, the optical input signal $OPT_{IN}$ can be an optical communication signal that can be implemented in a variety of different optical communications applications that may require a high sensitivity optical receiver, such as Li-Fi wireless communications. The photodiode 52 thus provides an input current signal $I_{OPT}$ having an amplitude that corresponds to an intensity of the optical input signal $OPT_{IN}$. As an example, TIA circuit 50 can be implemented as or as part of an integrated circuit (IC) chip.

The TIA circuit 50 includes an input capacitor $C_{IN}$ that is arranged in parallel with the photodiode 52 between the input node 54 and a low voltage rail, demonstrated in the example of FIG. 2 as ground. The TIA circuit 50 also includes an N-channel metal-oxide semiconductor field effect transistor (MOSFET) $N_1$ arranged as an input stage for the TIA circuit 50. In the example of FIG. 2, the N-channel MOSFET N1 is arranged as having a source coupled to the input node 54 and a drain coupled to an output node 56. A resistor $R_1$ interconnects the output node 56 and the high rail voltage $V_{DD}$, and a current path between the input node 54 and ground includes a second resistor $R_2$. Therefore, the N-channel MOSFET $N_1$ is arranged as a common-gate transistor to provide the output voltage $V_{OUT}$ at the output node 56 based on an amplitude of the input current signal $I_{OPT}$.

The TIA circuit 50 also includes a negative feedback transformer 58. The negative feedback transformer 58 includes a primary winding $L_P$ that interconnects the input node 54 and the resistor $R_2$, and a secondary winding $L_S$ that interconnects a predetermined DC bias voltage $V_B$ and a gate of the N-channel MOSFET $N_1$. The primary and secondary windings $L_P$ and $L_S$ are thus mutually magnetically coupled to provide anti-phase operation between the gate and the source of the N-channel MOSFET $N_1$. As a result, the transconductance of the N-channel MOSFET $N_1$ can be substantially increased. For example, the transconductance $g'_m$ of $N_1$ can be expressed as:

$$g'_m = (1+n*k)*g_m \qquad \text{Equation 1}$$

Whereas:

n is a turns ratio between the primary and secondary windings $L_P$ and $L_S$, and can be expressed as n= $\sqrt{L_S/L_P}$ k is a coupling coefficient of the negative feedback transformer 58; and $g_m$ is a nominal transconductance of the N-channel MOSFET $N_1$.

Therefore, as provided in Equation 1, the input impedance of the TIA circuit 50 decreases by a factor of (1+n*k). The input impedance of the TIA circuit 50 can thus be greatly reduced by implementing the negative feedback transformer 58. Because the input impedance of the TIA circuit 50 is inversely proportional to transconductance, decreasing the input impedance of the TIA circuit 50 results in an increase in the transconductance of the N-channel MOSFET $N_1$. As a result, based on the increase in the transconductance of the N-channel MOSFET $N_1$ via the negative feedback transformer 58, the bandwidth of the TIA circuit 50 can be extended to a significantly higher frequency relative to a typical TIA circuit. In addition, a typical TIA circuit can experience a more rapid increase in noise at relatively lower frequencies based on a reduced input pole frequency that effectively amplifies input-referred current noise associated with the current source (e.g., a photodiode). However, based on the increased input bandwidth provided by the negative feedback transformer 58, the TIA circuit 50 can achieve a slower increase in the noise current as frequency increases. Furthermore, in contrast to a TIA circuit that includes a cascode-arrangement input stage, the TIA circuit 50 can operate at a substantially reduced power (e.g., lower amplitude of the high voltage rail $V_{DD}$) based on a lack of transistor stacking by implementing the negative feedback transformer 58 to achieve negative feedback gain instead of the cascode-arrangement. Accordingly, the TIA circuit 50 can operate more efficiently than typical TIA circuits.

It is to be understood that the TIA circuit 50 is not intended to be limited to the example of FIG. 2. As an example, the TIA circuit 50 can implement a different arrangement for the input stage than the N-channel MOSFET $N_1$, such as by implementing alternative types of transistors. As another example, it is to be understood that the TIA circuit 50 could be implemented as or as part of an IC chip that includes additional components of an optical receiver system, such as an output buffer and/or an analog-to-digital converter (ADC). Accordingly, the TIA circuit 50 and/or an associated optical receiver system can be implemented in a variety of ways.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A transimpedance amplifier (TIA) system comprising:
    a transistor arranged between an input node and an output node to set an amplitude of an output voltage at the output node based on an amplitude of an input current signal provided at the input node;
    a negative feedback transformer coupled to the transistor to provide a negative feedback gain with respect to the output voltage to substantially increase transconductance of the transistor; and
    a resistor coupled between the output node and a high rail voltage;
    wherein the negative feedback transformer comprises a primary winding that is coupled to the input node and a secondary winding that is coupled between an input of the transistor and a bias voltage such that the transistor is controlled by the bias voltage via the secondary winding;
    wherein the high rail voltage and the bias voltage are different.

2. The system of claim 1, wherein the transistor is controlled by the bias voltage.

3. The system of claim 1, wherein the transistor is arranged as an N-channel metal-oxide semiconductor field-effect transistor (MOSFET) comprising a source coupled to the input node and a drain coupled to the output node.

4. An optical receiver comprising the TIA system of claim 1.

5. The optical receiver of claim 4, further comprising a photodiode to generate the input current signal as an input current in response to an input optical signal.

6. An integrated circuit (IC) chip comprising the TIA system of claim 1.

7. A transimpedance amplifier (TIA) system comprising:
    a transistor arranged between an input node and an output node to set an amplitude of an output voltage at the output node based on an amplitude of an input current signal provided at the input node; and
    a negative feedback transformer comprising a primary winding that is coupled to the input node and a secondary winding that is coupled between an input of the transistor and a bias voltage to provide a negative feedback gain with respect to the output voltage to substantially increase transconductance of the transistor, and such that the transistor is controlled by the bias voltage via the secondary winding; and
    a resistor coupled between the output node and a high rail voltage;
    wherein the high rail voltage and the bias voltage are different.

8. The system of claim 7, wherein the transistor is controlled by the bias voltage via the secondary winding.

9. The system of claim 8, wherein the transistor is arranged as an N-channel metal-oxide semiconductor field-effect transistor (MOSFET) comprising a source coupled to the input node and a drain coupled to the output node.

10. An optical receiver comprising the TIA system of claim 7, the optical receiver further comprising a photodiode to generate the input current signal in response to an input optical signal.

11. An optical receiver system comprising a transimpedance amplifier (TIA) system, the TIA system comprising:
    a photodiode to receive an optical input signal and to generate an input current signal in response to the optical input signal;
    a transistor arranged between an input node and an output node to set an amplitude of an output voltage at the output node based on an amplitude of the input current signal provided at the input node;

a negative feedback transformer comprising a primary winding that is coupled to the input node and a secondary winding that is coupled between an input of the transistor and a bias voltage to provide negative feedback gain with respect to the output voltage to substantially increase transconductance of the transistor, and such that the transistor is controlled by the bias voltage via the secondary winding; and a resistor coupled between the output node and a high rail voltage;

wherein the high rail voltage and the bias voltage are different.

12. The system of claim 11, wherein the transistor is arranged as an N-channel metal-oxide semiconductor field-effect transistor (MOSFET) comprising a source coupled to the input node and a drain coupled to the output node.

13. An integrated circuit (IC) chip comprising the TIA system of claim 11.

14. An integrated circuit (IC) chip comprising the TIA system of claim 7.

* * * * *